(12) United States Patent
Kim

(10) Patent No.: US 9,412,431 B2
(45) Date of Patent: Aug. 9, 2016

(54) SEMICONDUCTOR MEMORY DEVICE AND MEMORY SYSTEM INCLUDING THE SAME

(71) Applicant: SK hynix Inc., Gyeonggi-do (KR)

(72) Inventor: Jung-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/619,899

(22) Filed: Feb. 11, 2015

(65) Prior Publication Data
US 2016/0086650 A1   Mar. 24, 2016

(30) Foreign Application Priority Data
Sep. 24, 2014   (KR) ................. 10-2014-0127827

(51) Int. Cl.
G11C 7/00          (2006.01)
G11C 11/406        (2006.01)
G11C 11/408        (2006.01)

(52) U.S. Cl.
CPC ............ *G11C 11/406* (2013.01); *G11C 11/408* (2013.01)

(58) Field of Classification Search
CPC .................. G11C 11/406; G11C 11/40615
USPC ................... 365/222, 236, 189.07
See application file for complete search history.

(56) References Cited

U.S. PATENT DOCUMENTS

| | | | | |
|---|---|---|---|---|
| 7,145,828 B2* | 12/2006 | Lee | ........... | G11C 11/406 365/222 |
| 7,397,719 B2* | 7/2008 | Takahashi | ........... | G11C 11/406 365/185.08 |
| 8,441,879 B2* | 5/2013 | Ichimura | ........... | G11C 11/406 365/222 |

FOREIGN PATENT DOCUMENTS

KR   1020010004653   1/2001

* cited by examiner

*Primary Examiner* — Son Dinh
(74) *Attorney, Agent, or Firm* — IP & T Group LLP

(57) ABSTRACT

A semiconductor memory device includes: a command generator suitable for generating an internal active command signal corresponding to an active command signal, wherein, when an active section of the active command signal lasts for a predetermined time or longer, the internal active command signal is additionally activated; an address storage suitable for storing an address signal based on an activation number of the internal active command signal; and a refresh operation driver suitable for performing a refresh operation on a word line corresponding to the stored address signal.

16 Claims, 10 Drawing Sheets

SEMICONDUCTOR MEMORY DEVICE AND MEMORY SYSTEM INCLUDING THE SAME

CROSS-REFERENCE TO RELATED APPLICATIONS

The present application claims priority of Korean Patent Application No. 10-2014-0127827, filed on Sep. 24, 2014, which is incorporated herein by reference in its entirety.

BACKGROUND

1. Field

Exemplary embodiments of the present invention relate to a semiconductor design technology and, more particularly, to a semiconductor memory device that performs a refresh operation.

2. Description of the Related Art

In general, semiconductor memory devices, such as double data rate synchronous dynamic random access memory (DDR SDRAM), include a plurality of memory banks for storing data. Each of the memory banks includes a plurality of memory cells. The memory cells generally include a cell capacitor for storing an electric charge (corresponding to data) and a cell transistor that serves as a switch. Data stored in the capacitor of the memory cell is determined according to the amount of charge stored. When the charge is large, the memory cell is said to store high data (logic 1). On the other hand, when the charge is small, or the capacitor is discharged, the memory cell is said to store low data (logic 0). That is, a semiconductor memory device stores data by charging and discharging the cell capacitors of the memory cells.

In principle, the charge of cell capacitor should be held constant in the absence of outside activity. However, in actuality, the charge is influenced due to conditions surrounding the cell capacitor, for example, voltage differences between the cell region and a peripheral circuit. In other words, charges may leak out of a charged cell capacitor, or charges may enter a discharged cell capacitor. Changes in the amount of charge being held in the cell capacitor may lead data stored therein being changed, which means that data may be lost. To prevent data from being lost, semiconductor memory devices perform refresh operations. Since refresh operations are widely known to those skilled in the art to which this present invention pertains, a detailed description of refresh operations will not be provided.

As semiconductor fabrication technology continues to make progress, day by day, the integration degree of semiconductor memory devices continues to increase, enabling the dimensions of the memory banks within to be shrunk. Such shrinkage, however, has brought about new concerns. To be specific, the shrinkage in the dimensions of memory banks results in the space between the memory cells becoming increasingly narrow, and this means that when a memory cell operates, other memory cells disposed adjacent to the operating memory cell is likely to be affected, unintentionally. This increased possibility that neighboring memory cells will be affected causes concern.

FIG. 1 is a diagram illustrating a memory bank of a conventional semiconductor memory device. The memory bank of a conventional semiconductor memory device includes a plurality of memory cells, and each of the memory cells includes a cell transistor and a cell capacitor. Each of the memory cells is coupled with a word line and a bit line. Hereafter, for the sake of convenience, three word lines disposed adjacent to each other are representatively described.

Referring to FIG. 1, the memory bank includes first to third word lines WL_K−1, WL_K and WL_K+1, and the word lines are coupled with first to third memory cells MC_K−1, MC_K and MC_K+1, respectively.

Hereafter, it is assumed that the second word line WL_K is activated during an active operation, for the sake of convenience.

When the second word line WL_K is activated, the data stored in the second memory cell MC_K is transmitted to a bit line BL, and the data transmitted to the bit line BL is transmitted to a bit line sense amplifying circuit (not illustrated). The bit line sense amplifying circuit then compares a voltage level of the bit line BL and a voltage level of a complementary bit line /BL with each other and amplifies the voltage difference. As a result, the bit line BL and the complementary bit line /BL are amplified to a pull-up voltage and a pull-down voltage based on the sensed data of the second memory cell MC_K.

Meanwhile, the cell transistor of the second memory cell MC_K and the cell transistor of the third memory cell MC_K+1 are formed in the same well. Therefore, when the second word line WL_K is activated, a threshold voltage of the cell transistor of the third memory cell MC_K+1 coupled with the third word line WL_K+1 is lowered. The decrease in the threshold voltage of the cell transistor of the third memory cell MC_K+1 causes current leakage between the cell transistor of the third memory cell MC_K+1 and the bit line BL. For this reason, if the second word line WL_K continues to be activated, the amount of charge stored in the cell transistor of the third memory cell MC_K+1 is decreased, in other words, the cell transistor of the third memory cell MC_K+1 is discharged, and the data stored in the third memory cell MC_K+1 is eventually lost. When the second memory cell MC_K and the first memory cell MC_K−1 are formed in the same well, current leakage occurs in the first memory cell MC_K−1. Herein, the disposition of the memory cells and wells may be changed depending on design.

On the other hand, a semiconductor memory device having the above-described structure performs a refresh operation in which the first to third word lines WL_K−1, WL_K and WL_K+1 are sequentially activated at a predetermined cycle. In consideration of the refresh operation, the drawback of the current leakage occurring in the third memory cell MC_K+1 may be resolved by controlling the cycling of the refresh operations. In other words, the data may be prevented from being lost if the refresh operation cycle for all word lines is short enough so that the data is not lost due to current leakage. However, it may be inefficient in terms of circuit operation and power consumption to make the other word lines, that is, the first word line WL_K−1 and the second word line WL_K, perform the refresh operations at shorter intervals due to the current leakage occurring in the third memory cell MC_K+1 corresponding to the third word line WL_K+1. In sum, it may not be efficient to make the refresh operation cycles of other word lines shorter for the sake of a specific word line.

SUMMARY

Various embodiments of the present invention are directed to a semiconductor memory device capable of performing a refresh operation for a specific word line among a plurality of word lines.

In accordance with an embodiment of the present invention, a semiconductor memory device may include: a command generator suitable for generating an internal active command signal corresponding to an active command signal, wherein, when an active section of the active command signal lasts for a predetermined time or longer, the internal active command signal is additionally activated; an address storage suitable for storing an address signal based on an activation number of the internal active command signal; and a refresh operation driver suitable for performing a refresh operation on a word line corresponding to the stored address signal.

The command generator may include: a normal activating unit for activating the internal active command signal based on the active command signal; and a virtual activating unit for activating the internal active command signal based on the predetermined time.

The semiconductor memory device may further include: an enable controller suitable for controlling whether to enable an operation of storing the address signal in an arbitrary section.

In accordance with an embodiment of the present invention, a semiconductor memory device may include: a command generator suitable for receiving an active command signal, and modifying the received active command signal into an internal active command signal corresponding to an activity type; an address storage suitable for storing an address signal based on an activation number of the internal active command signal; a counter suitable for counting the internal active command signal corresponding to the activity type; and a refresh operation driver suitable for receiving the address signal corresponding to an output signal of the counter, and performing a refresh operation on a word line corresponding to the stored address signal.

The activity type may be divided based on an active section of the active command signal and the number of times that the active command signal is activated in a predetermined section.

The activity type may be divided into a first activity type and a second activity type, and the semiconductor memory device may further include: a first command generator suitable for receiving the active command signal of the first activity type and generating a first internal active command signal; and a second command generator suitable for receiving the active command signal of the second activity type and generating a second internal active command signal.

The first activity type may include an active command signal having an active section where the active command signal is activated for a predetermined time or longer, and the number of times that the first internal active command signal is activated may exceed the number of times that the active command signal of the first activity type is activated.

The second activity type may include an active command signal that is activated a predetermined number of times within a predetermined time, and the number of times that the second internal active command signal is activated may correspond to the number of times that the active command signal of the second activity type is activated.

The address storage may include: a first address storing unit for storing the address signal based on the first internal active command signal; and a second address storing unit for storing the address signal based on the second internal active command signal.

The counter may include: a first counting unit for counting the number of times that the first internal active command signal is activated; and a second counting unit for counting the number of times that the second internal active command signal is activated.

The semiconductor memory device may further include: a comparator suitable for comparing a counting value of the first counting unit and a counting value of the second counting unit with each other.

The address storage may provide the refresh operation driver with the address signal that is stored based on the internal active command signal corresponding to one between the first internal active command signal and the second internal active command signal based on an output signal of the comparator.

The semiconductor memory device may further include: an enable controller suitable for controlling whether to enable an operation of storing the address signal in a predetermined section.

In accordance with an embodiment of the present invention, a memory system may include: a controller suitable for generating access type information corresponding to a data to be processed; and a semiconductor memory device suitable for performing a read/write operation on the data under a control of the controller, modifying an internal control signal for storing a refresh target address based on the access type information, and performing a refresh operation on a word line corresponding to the refresh target address.

The access type information may correspond to the amount of a data whose access time is equal to or longer than a predetermined time occupied in the data processed in the controller.

The internal control signal may be generated by modifying an active command signal provided by the controller.

The semiconductor memory device may include: a command generator suitable for receiving the active command signal and modifying the received active command signal into an internal active command signal corresponding to an activity type; an address storage suitable for storing an address signal based on the internal active command signal; a counter suitable for counting the internal active command signal corresponding to the activity type, individually; and a refresh operation driver suitable for receiving an address signal corresponding to an output signal of the counter among the address signals stored in the address storage, and performing a refresh operation on a word line corresponding to the address signal.

The command generator may control the number of times that the internal active command signal is activated based on the access type information.

The counter may control a counting unit based on the access type information.

The activity type may be divided based on an active section of the active command signal and the number of times that the active command signal is activated in a predetermined section.

DETAILED DESCRIPTION

Figure 1:
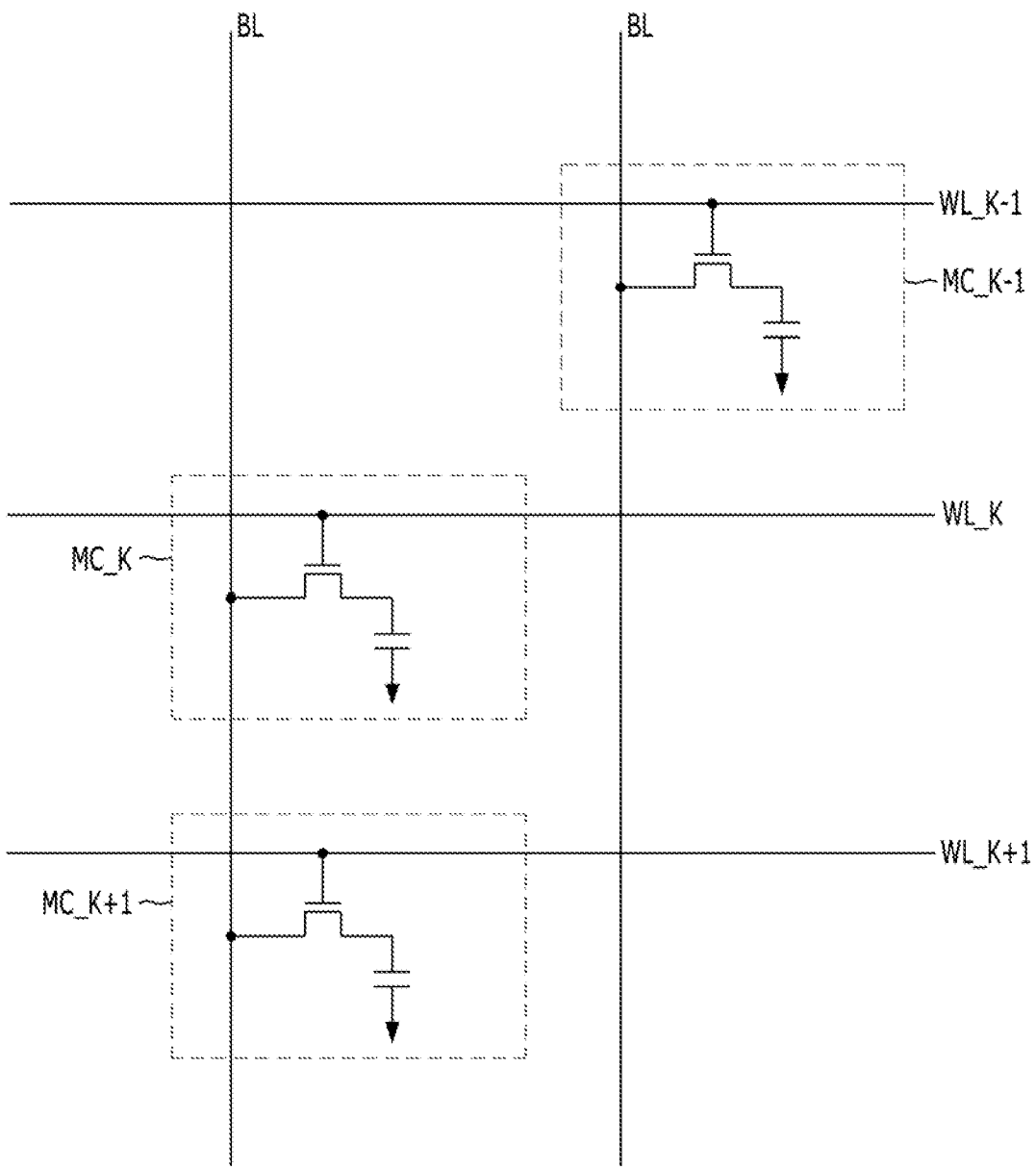
FIG. 1 is a diagram illustrating a memory bank of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to a case where the first layer is formed directly on the second layer or the substrate but also to where a third layer exists between the first layer and the second layer or the substrate.

Figure 2:
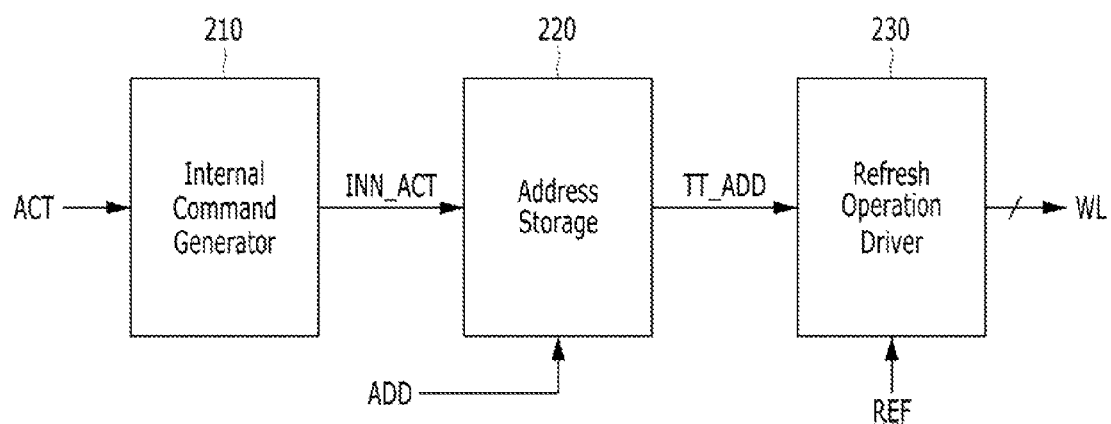
FIG. 2 is a block diagram illustrating a semiconductor memory device in accordance with an embodiment of the present invention.

FIG. 2 is a block diagram illustrating a semiconductor memory device in accordance with an embodiment of the present invention.

Referring to FIG. 2, the semiconductor memory device may include an internal command generator 210, an address storage 220, and a refresh operation driver 230.

The internal command generator 210 receives an active command signal ACT and generates an internal active command signal INN_ACT. The active command signal ACT is a command signal for activating a word line when the semiconductor memory device performs a normal operation. When the active command signal ACT is activated, a word line corresponding to an address signal ADD that is inputted along with the active command signal ACT is activated. Hereafter, for the sake of convenience, an activation section of the word line is defined as 'an active section'. The internal active command signal INN_ACT is activated in response to the active command signal ACT. The internal active command signal INN_ACT is additionally activated (as if the active command signal ACT is activated again) when the active section lasts for a predetermined time or longer. In this case, the number of times that the internal active command signal INN_ACT is activated exceeds the number of times that the active command signal ACT is activated.

The address storage 220 stores the address signal ADD in response to the internal active command signal INN_ACT, and outputs the address signal ADD as a target address signal TT_ADD. Herein, the target address signal TT_ADD may be address information on a word line that is activated during a refresh operation.

First the target address signal TT_ADD will be described in detail with reference to FIG. 1. For example when the second word line WL_K is activated during an active operation, current leakage occurs in the third memory cell MC_K+1 corresponding to the third word line WL_K+1, as described earlier. The semiconductor memory device controls the activation operation of the third word line WL_K+1 that is disposed adjacent to the second word line WL_K during a refresh operation. For such control, the address information of the word line that is to be refreshed is needed, and the target address signal TT_ADD may have the address information. In other words, the target address signal TT_ADD may be the address information corresponding to the third word line WL_K+1 that is a direct target for the refresh operation, and it may be the address information corresponding to a second word line WL_K that is disposed adjacent to the third word line WL_K+1 and capable of being a reference to the third word line WL_K+1. Herein, the memory cell coupled with the second word line WL_K may be included in the same well with a memory cell corresponding to the first word line WL_K−1 and/or a memory cell corresponding to the third word line WL_K+1. In such case, the target address signal TT_ADD may be the address information corresponding to the first word line WL_K−1 and/or the third word line WL_K+1.

Meanwhile, the refresh operation driver 230 performs a refresh operation on a word line corresponding to the target address signal TT_ADD among the word lines WL in response to a refresh command signal REF.

When an active section of the active command signal ACT lasts for a predetermined time or longer, the semiconductor memory device additionally activates the internal active command signal INN_ACT to store the target address signal TT_ADD and performs a refresh operation on the corresponding word line by using the stored target address signal TT_ADD.

Figure 3:
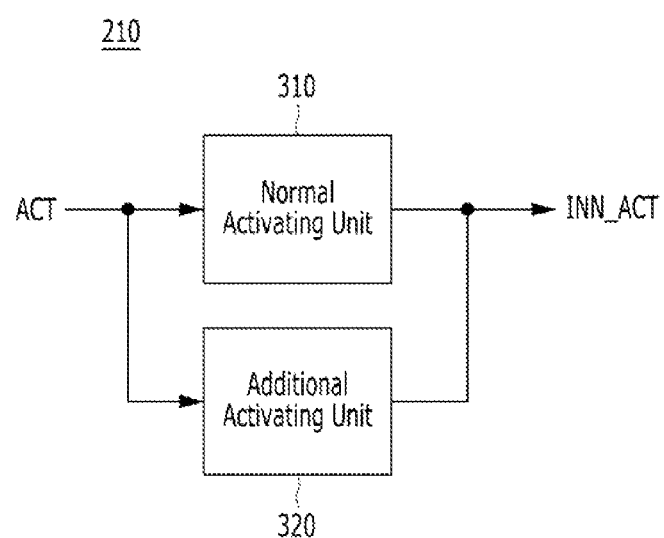
FIG. 3 is a detailed diagram of an internal command generator shown in FIG. 2.

FIG. 3 is a detailed diagram of the internal command generator 210 shown in FIG. 2.

Referring to FIG. 3, the internal command generator 210 may include a normal activating unit 310 and an additional activating unit 320.

The normal activating unit 310 activates the internal active command signal INN_ACT in response to the active command signal ACT. Herein, the moment that the active command signal ACT is activated corresponds to the moment that the internal active command signal INN_ACT is activated, and this signifies that the number of times that the active command signal ACT is activated corresponds to the number of times that the internal active command signal INN_ACT is activated.

The additional activating unit 320 activates the internal active command signal INN_ACT after a predetermined time passes from the moment when the active command signal ACT is activated. The additional activating unit 320 may be designed in diverse forms. Herein, a case where the active command signal ACT is received and used to activate the internal active command signal INN_ACT is taken as an example. In this case, an oscillator may be used. In other words, it may be possible to design the additional activating unit 320 to activate the internal active command signal INN_ACT when the active command signal ACT is activated and an oscillator may be used for a counting operation for a predetermined time or longer before the next active command signal ACT is activated. Meanwhile, although a case where the additional activating unit 320 receives the active command signal ACT is described in the embodiment of FIG. 3, it may also be possible to design the additional activating unit 320 to use the address signal ADD that is inputted along with the active command signal ACT.

Figure 4:
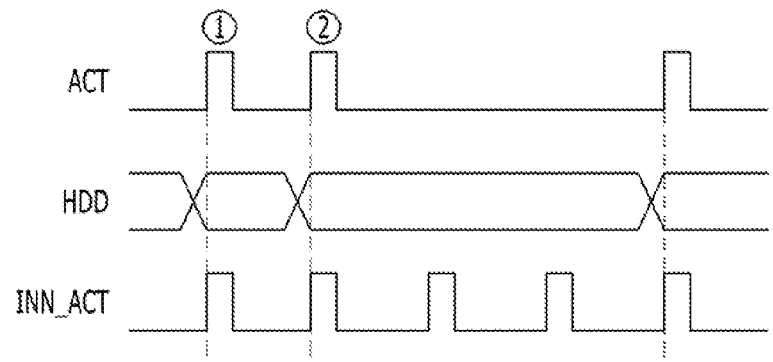
FIG. 4 is a timing diagram for describing an operation of the internal command generator shown in FIG. 3.

FIG. 4 is a timing diagram for describing an operation of the internal command generator 210 shown in FIG. 3. FIG. 4 shows the active command signal ACT, the address signal ADD, and the internal active command signal INN_ACT.

Hereafter, for the sake of convenience, two examples of how the active command signal ACT is inputted will be described. The first input type denotes that the active command signal ACT is inputted and then the next active command signal ACT is inputted before a predetermined time passes from the moment when the active command signal ACT is inputted. The second input type denotes that the active command signal ACT is inputted and then the next active command signal ACT is inputted after a predetermined time passes from the moment when the active command signal ACT is inputted. In the first input type, the internal active command signal INN_ACT is activated whenever the active command signal ACT is inputted.

Referring to FIG. 4, case ① refers to when the active command signal ACT has the first input type, and case ② refers to when the active command signal ACT has the second input type.

As shown in FIG. 4, the internal active command signal INN_ACT is activated in response to the active command signal ACT of case ① and the active command signal ACT of case ②. In particular, when the active command signal ACT is inputted according to case ②, the internal active command signal INN_ACT is activated once at the moment when the active command signal ACT is activated and then the internal active command signal INN_ACT is activated twice more. From the perspective of the internal active command signal INN_ACT, the active command signal ACT is additionally (or virtually) activated. When the active command signal ACT is inputted according to case ②, the number of times that the internal active command signal INN_ACT is activated becomes '3' in total.

When the active command signal ACT is inputted according to case ②, the semiconductor memory device may control the number of times that the internal active command signal INN_ACT is activated to be greater than the number of times that the active command signal ACT is activated and control the operation of storing the address signal ADD.

Figure 5:
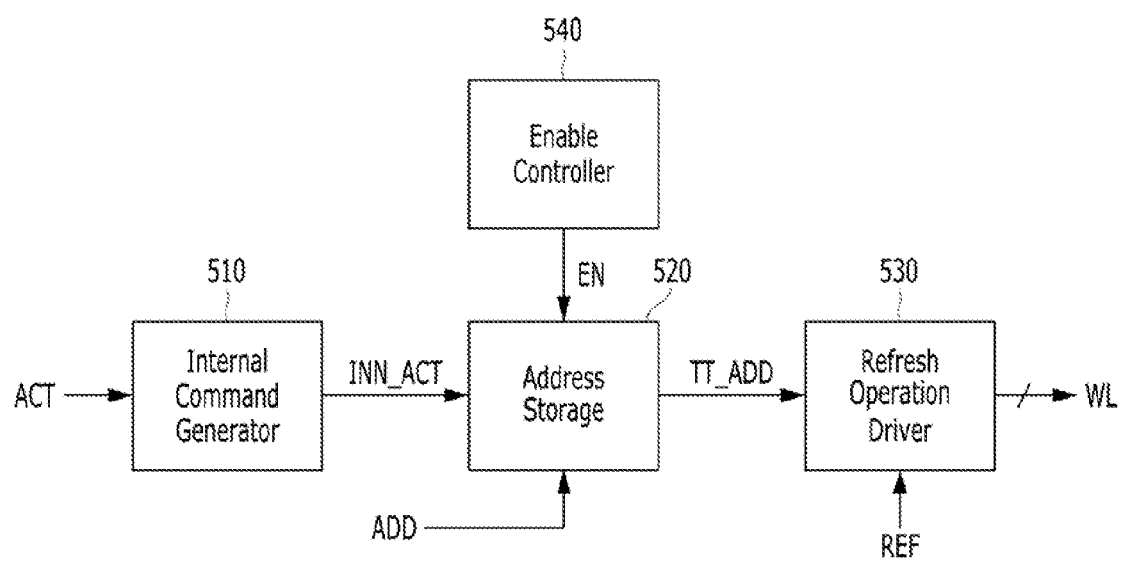
FIG. 5 is a block diagram illustrating a semiconductor memory device in accordance with an embodiment of the present invention.

FIG. 5 is a block diagram illustrating a semiconductor memory device in accordance with an embodiment of the present invention.

Referring to FIG. 5, the semiconductor memory device may include an internal command generator 510, an address storage 520, a refresh operation driver 530, and an enable controller 540. Since the internal command generator 510, the address storage 520 and the refresh operation driver 530 correspond to the internal command generator 210, the address storage 220 and the refresh operation driver 230 that are shown in FIG. 2, respectively, detailed descriptions on them are omitted herein. Hereafter, the enable controller 540, which is added in the embodiment of FIG. 5, is described.

The enable controller 540 controls whether to enable an operation of storing an address signal ADD. The enable controller 540 generates an enable signal EN for controlling the moment when the address storage 520 is activated. The enable signal EN has an arbitrary activation section, which is to be described again later. Thus, the address storage 520 is activated in the arbitrary activation section according to the enable signal EN and, in the arbitrary activation section, the address storage 520 stores the address signal ADD in response to an internal active command signal INN_ACT. As described earlier, the stored address signal ADD becomes a target address signal TT_ADD, and a refresh operation on a specific word line may be performed based on the target address signal TT_ADD.

Figure 6:
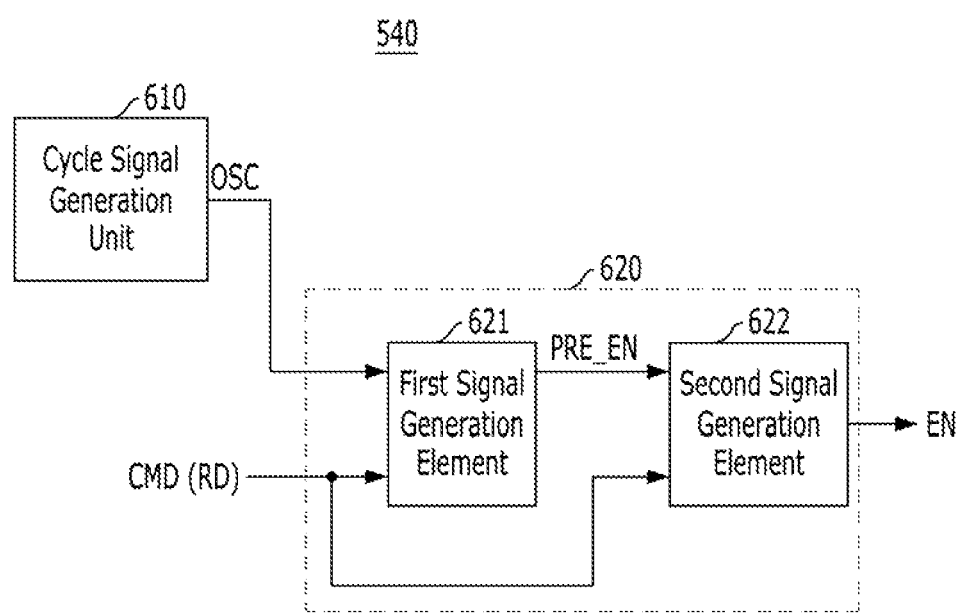
FIG. 6 is a detailed diagram of an enable controller shown in FIG. 5 according to a first example.

FIG. 6 is a detailed diagram of the enable controller 540 shown in FIG. 5 according to a first example.

Referring to FIGS. 5 and 6, the enable controller 540 may include a cycle signal generation unit 610 and an enable signal generation unit 620.

The cycle signal generation unit 610 generates an oscillation signal OSC that toggles at a predetermined cycle. Herein, the cycle of the oscillation signal OSC may be set in various ways according to how the semiconductor memory device is designed. For example, the semiconductor memory device may be designed to set the cycle of the oscillation signal OSC in the range of a couple of nanoseconds (ns) to hundreds of microseconds (μs). Of course, it may be possible to set the cycle of the oscillation signal OSC in the other ranges. The number of times that the address storage 520 is enabled and stores the address signal ADD may be controlled based on the cycle of the oscillation signal OSC. In other words, the address storage 520 stores the address signal ADD more frequently as the cycle of the oscillation signal OSC becomes shorter, and the address storage 520 stores the address signal ADD less frequently as the cycle of the oscillation signal OSC becomes longer. The cycle signal generation unit 610 may include an oscillator.

The enable signal generation unit 620 generates the enable signal EN in response to a command signal CMD and the oscillation signal OSC. The enable signal generation unit 620 may include a first signal generation element 621 and a second signal generation element 622. Herein, it is assumed that the command signal CMD is a read command signal RD that is activated during a read operation. The first signal generation element 621 outputs the oscillation signal OSC as a pre-enable signal PRE_EN in response to the read command signal RD. The second signal generation element 622 outputs the pre-enable signal PRE_EN as the enable signal EN in response to the read command signal RD. The first signal generation element 521 and the second signal generation element 622 may include a shifter.

Figure 7:
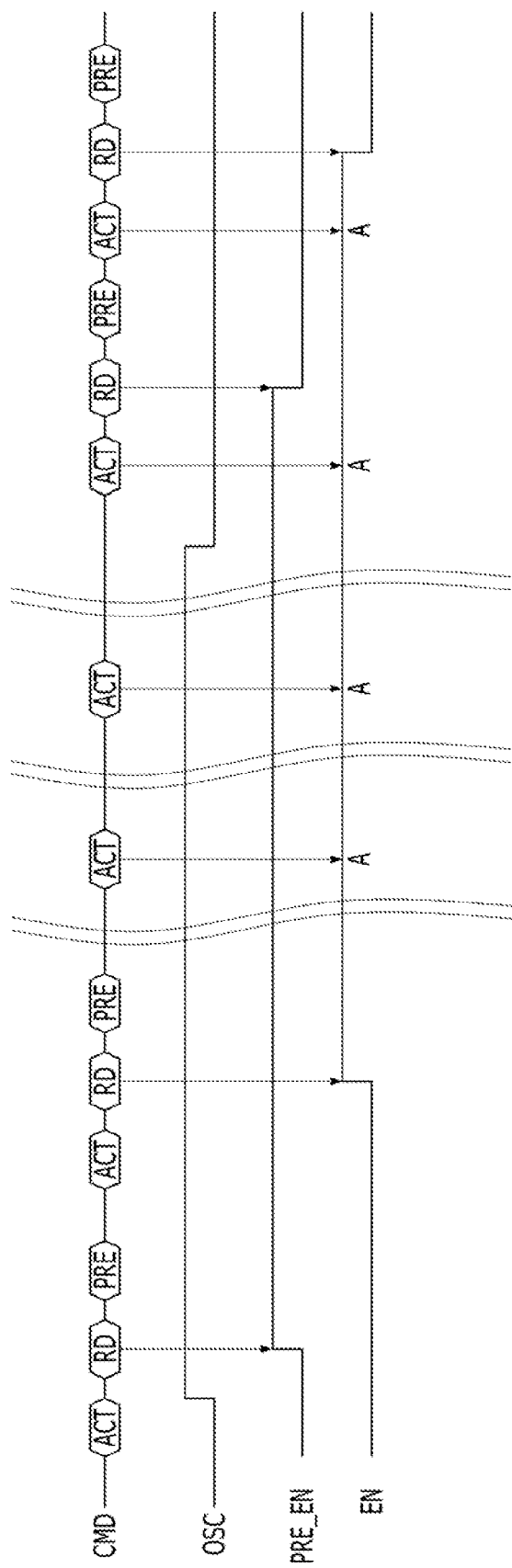
FIG. 7 is a timing diagram a portion of an operation of the enable controller shown in FIG. 6.

FIG. 7 is a timing diagram for describing an operation of the enable controller 540 shown in FIG. 6. FIG. 7 shows the command signal CMD, the pre-enable signal PRE_EN, and the enable signal EN.

First, the oscillation signal OSC comes to be a logic high level at an arbitrary moment. Herein, when the read command signal RD is inputted, the pre-enable signal PRE_EN goes to a logic high level, and then when the read command signal RD is inputted again, the enable signal EN is activated to a logic high level. The address storage 520 shown in FIG. 5 is enabled in response to the enable signal EN, and stores the address signal ADD in response to an internal active command signal INN_ACT. As described earlier, the internal active command signal INN_ACT is activated in response to an active command signal ACT. Therefore, as shown in FIG. 7, the address signal ADD is stored (A) in response to the active command signal ACT in a section where the enable signal EN is activated. Although not illustrated in FIG. 7, the internal active command signal INN_ACT is activated when an active section lasts for a predetermined time or longer, too. In this case, the address signal ADD may be stored (A), too.

Meanwhile, FIG. 7 shows both a case where the enable signal EN is activated and a case where the enable signal EN is deactivated to describe the storing (A) of the address signal ADD. However, the read command signal RD and the oscillation signal OSC are not in a close relationship with each other. Therefore, the enable signal EN generated based on the read command signal RD and the oscillation signal OSC may have an arbitrary enable moment.

Meanwhile, FIG. 7 exemplarily shows the enable signal EN being activated or deactivated when the read command signal RD is inputted twice. However, the kind of the command signal CMD and the number of times that the command signal CMD is inputted may be different according to how the semiconductor memory device is designed. For example, the enable signal EN may be activated when the oscillation signal OSC is in a logic high level and a precharge command signal PRE is inputted twice, and then deactivated when the oscillation signal OSC is in a logic low level and a write command WT is inputted three times.

After all, the enable signal EN has an arbitrary activation section, and this means that the address storage 520 may store the address signal ADD in response to the internal active command signal INN_ACT in an arbitrary section.

The address storage 520 shown in FIG. 5 stores the corresponding address signal ADD when the internal active command signal INN_ACT is inputted in the activation section of the enable signal EN. The address storage 520 may store all the address signal's ADD corresponding to the internal active command signal INN_ACT, or store some of the address signals ADD corresponding to the internal active command signal INN_ACT. For example, when the address storage 520 is capable of storing one address signal ADD, the address storage 520 may store the address signal ADD corresponding to the first internal active command signal INN_ACT after the enable signal EN is activated and then does not store any address signals ADD, or the address storage 520 may activate the enable signal EN by updating a previously stored address signal ADD with a currently inputted address signal ADD and store the address signal ADD corresponding to the last internal active command signal INN_ACT.

Figure 8:
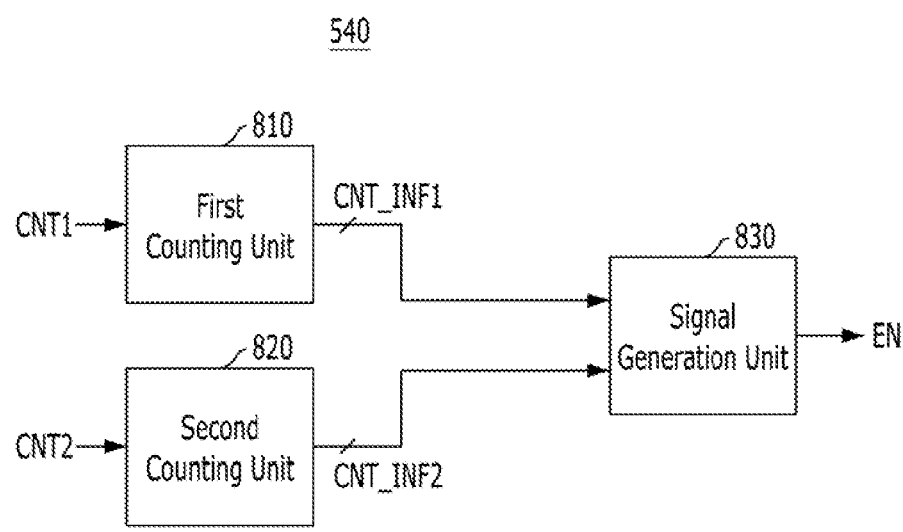
FIG. 8 is a detailed diagram of the enable controller shown in FIG. 5 according to a second example.

FIG. 8 is a detailed diagram of the enable controller 540 shown in FIG. 5 according to a second example.

Referring to FIG. 8, the enable controller 540 may include a first counting unit 810, a second counting unit 820, and a signal generation unit 830.

The first counting unit 810 may perform a counting operation in response to a first counting signal CNT1 and generate a first counting information CNT_INF1 corresponding to the counting result. The first counting unit 810 may make the first counting information CNT_INF1 have an offset value or make some of a plurality of bits of the first counting information CNT_INF1 have fixed values. When the first counting information CNT_INF1 reaches a predetermined value, the first counting unit 810 initializes the first counting information CNT_INF1 to an initial value and counts the first counting signal CNT1 from the beginning. The first counting information CNT_INF1 having an offset value means that the first counting information CNT_INF1 has a predetermined value. For example, when the first counting information CNT_INF1 is a 7-bit signal and it is increased by '1' whenever the first counting signal CNT1 is activated, the initial value is a fixed value such as '0001000' instead of '0000000'. Also, some of the bits of the first counting information CNT_INF1 having a fixed value means that, for example, the first counting information CNT_INF1 is a seven-bit signal and the third bit is fixed to '1' ('0010000': the underlined bit is always '1') and the other bits are changed through a counting operation.

The second counting unit 820 may perform a counting operation in response to a second counting signal CNT2 and generate a second counting information CNT_INF2 corresponding to the counting result. The second counting unit 820 may initialize the value of the second counting information CNT_INF2 when the address signal ADD is stored in the address storage 520 (see FIG. 5).

The signal generation unit 830 compares the first, counting information CNT_INF1 with the second counting information CNT_INF2 and generates the enable signal EN. The enable signal EN is activated when the first counting information CNT_INF1 and the second counting information CNT_INF2 have corresponding values. For example, all the bits of the first counting information CNT_INF1 and the second counting information CNT_INF2 may have the same value, or all or part of the bits of the first counting information CNT_INF1 and all or part of the bits of the second counting information CNT_INF2 may have the same value.

Meanwhile, the first counting signal CNT1 and the second counting signal CNT2 may be substituted with the active command signal ACT, the precharge command signal PRE, the write command signal WT, the read command signal RD, and a refresh command signal REF.

Hereafter, it is assumed that the first counting signal CNT1 is the read command signal RD and the second counting signal CNT2 is the active command signal ACT. Each of the first counting information CNT_INF1 and the second counting information CNT_INF2 is a 9-bit signal, and the fifth bit of the first counting information CNT_INF1 is fixed into '1'. Also, it is assumed that the first counting information CNT_INF1 and the second counting information CNT_INF2 are initialized after all the bits become '1', and when all the bits are the same, the address storage 520 stores the address signal ADD.

First, when the active command signal ACT is inputted 32 times while the first counting information CNT_INF1 is 000010000', the second counting information CNT_INF2 becomes '000010000'. Thus, the enable signal EN is activated, and the address signal ADD is stored in response to the internal active command signal INN_ACT. Subsequently, the second counting information CNT_INF2 may be initialized to '000000000'. Meanwhile, it is assumed that before the address signal ADD is stored, the read command signal RD is activated three times and the first counting information CNT_INF1 becomes 000010011'. In this case, the address may be stored when the active command signal ACT is inputted 35 times from a moment when the previous address is stored. When the first counting information CNT_INF1 is '111111111', the address is stored only after the active command signal ACT is inputted 1023 times, and then when the read command signal RD is activated, the first counting information CNT_INF1 may be initialized to '000010000'.

Since the value of the first counting information CNT_INF1 is changed continuously while the value of the second counting information CNT_INF2 is increased, the section where the address storage 520 stores the address signal ADD continues to be changed as well and the number of times that the address storage 520 stores the address signal ADD are changed continuously. This signifies that a refresh target address may be stored in a arbitrary section.

Figure 9:
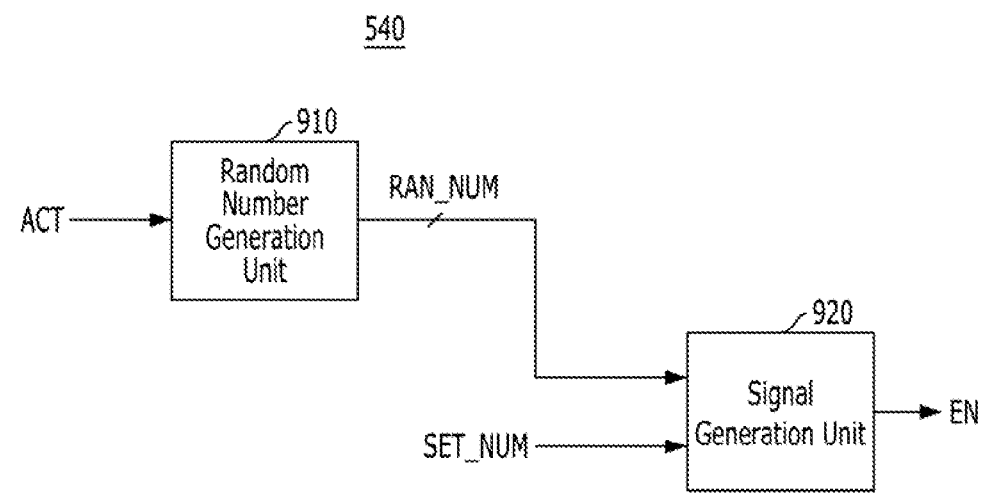
FIG. 9 is a detailed diagram of the enable controller shown in FIG. 5 according to a third example.

FIG. 9 is a detailed diagram of the enable controller 540 shown in FIG. 5 according to a third example.

Referring to FIG. 9, the enable controller 540 may include a random number generation unit 910 and a signal generation unit 920.

The random number generation unit 910 generates a random number RAN_NUM when the active command signal ACT is activated. For example, the random number generation unit 910 may randomly generate one natural number among natural numbers having a maximum value. Most of the random numbers generated in the random number generation unit 910 are not generated periodically, and a generated random number and the next random number may be generated independently from each other.

The signal generation unit 920 generates the enable signal EN in response to the random number RAN_NUM, generated in the random number generation unit 910, and a predetermined set value SET_NUM. The set value SET_NUM may be a natural number that is equal to or less than the maximum value that the random number RAN_NUM may have. The enable signal EN is activated when the random number RAN_ NUM and the set value SET_NUM are the same.

The enable signal EN shown in FIG. 9 is generated in response to the random number RAN_NUM and the set value SET_NUM. The random number RAN_NUM is an arbitrary natural number. Therefore, the enable signal EN generated based on the random number RAN_NUM, too, may have an arbitrary activation moment. As the maximum value of the random number RAN_NUM becomes small, the address storage 520 stores the address ADD more frequently, and as the maximum value of the random number RAN_NUM becomes great, the address storage 520 stores the address ADD less frequently.

Therefore, the semiconductor memory device may resolve the drawback of current leakage occurring in a memory cell corresponding to a specific word line. In other words, when a word line is activated for a time longer than a predetermined time, current leakage occurs in the neighboring memory cells but it may be resolved through a refresh operation on the word line corresponding to the memory cell.

As the integration degree of the semiconductor memory device is increased, the gap between the Word lines narrows, and this causes concern.

For the sake of convenience, FIG. 1 is referred to again, and it is assumed that a second word line WL_K is activated during an active operation.

When the second word line WL_K, disposed in the center of first to third word lines WL_ K–1, WL_K and WL_K+1, is activated, voltage levels of the first word line WL_K–1 and the third word line WL_K+1 raise or drop unintentionally due to the coupling effect. When the voltage levels of the first word line WL_K–1 and the third word line WL_K+1 become unstable, the data stored in the cell capacitor of a first memory cell MC_K–1 and the cell capacitor of a third memory cell MC_K-1-1 may be lost. The loss of data may be worse when the second word line WL_K is frequently and discontinuously activated.

Hereafter, the target address signal TT_ADD in this case is described.

For example, when the second word line WL_K is activated during an active operation, the coupling effect occurs in the first word line WL_K–1 and the third word line WL_K+1 as described above. The semiconductor memory device controls the activation operation on the first word line WL_K–1 and the third word line WL_K+1 during a refresh operation. Herein, what is needed is the address information on the word line that becomes the target of the refresh operation, and the target address signal TT_ADD may have the information corresponding thereto. In other words, the target address signal TT_ADD may be the address information corresponding to the first word line WL_K–1 and the third word line WL_K+1 that are direct targets of the refresh operation, or it may be the address information corresponding to the second word line WL_K that is disposed adjacent to the first word line WL_K–1 and the third word line WL_K+1 and used for referring to the first word line WL_K–1 and the third word line WL_K+1.

Hereafter, an embodiment where both current leakage and coupling effects occur in a semiconductor memory device is described. For the sake of convenience, the embodiment is described by dividing the active command signal into two activity types. The active command signal of the first activity type has an active section where the active command signal is activated for a predetermined time or longer, which is described above. The active command signal of the second activity type is activated several times within a predetermined time. The active command signal of the second activity type corresponds to one word line. The active command signal of the first activity type has the concern of current leakage occurring in the memory cell, and the active command signal of the second activity type has the concern of coupling effects occurring in the word line.

Figure 10:
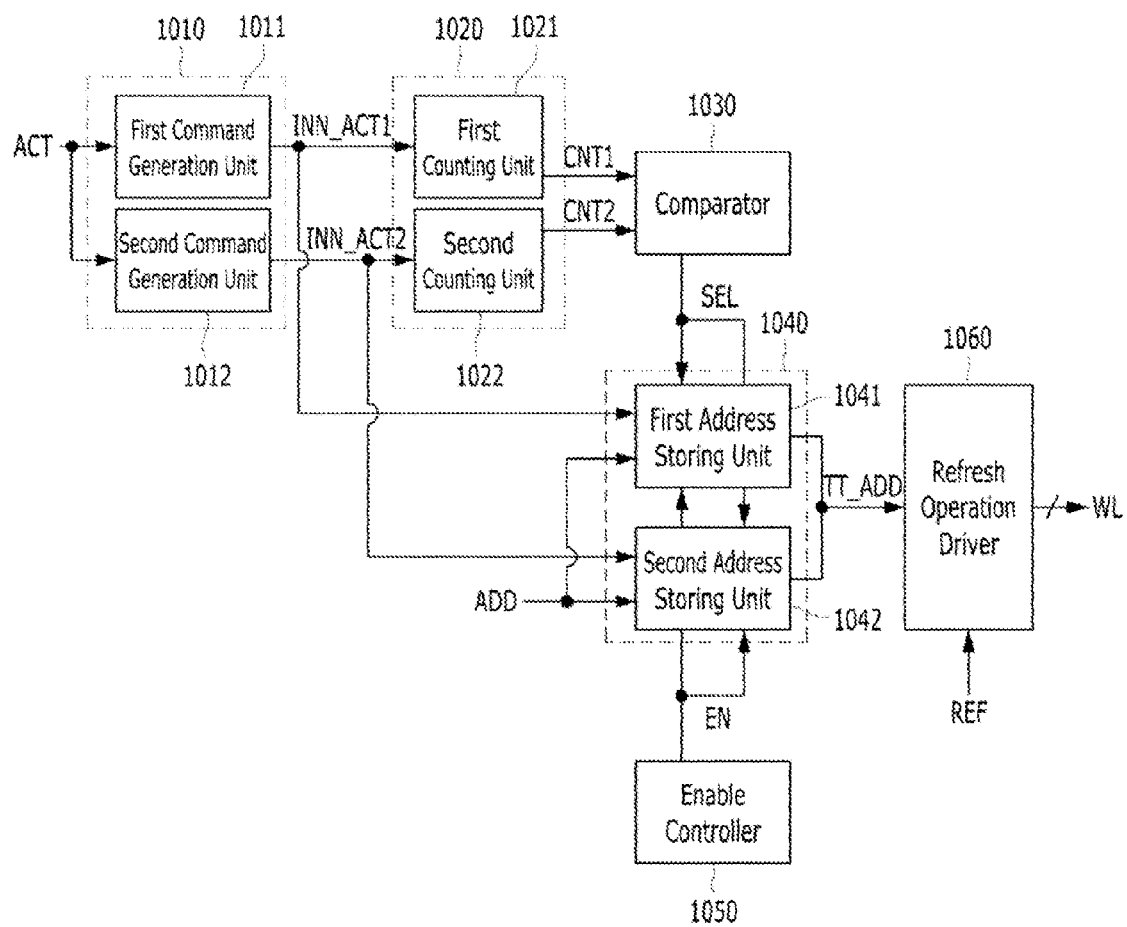
FIG. 10 is a block diagram illustrating a semiconductor memory device in accordance with an embodiment of the present invention.

FIG. 10 is a block diagram illustrating a semiconductor memory device in accordance with an embodiment of the present invention.

Referring to FIG. 10, the semiconductor memory device may include a command generator 1010, a counter 1020, a comparator 1030, an address storage 1040, an enable controller 1050, and a refresh operation driver 1060.

The command generator 1010 receives an active command signal ACT and modifies it into a first internal active signal INN_ACT1 and a second internal active signal INN_ACT2. The command generator 1010 may include a first command generation unit 1011 and a second command generation unit 1012. The first command generation unit 1011 generates the first internal active signal INN_ACT1 in response to the active command signal ACT of the first activity type, and the second command generation unit 1012 generates the second internal active signal INN_ACT2 in response to the active command signal ACT of the second activity type. The first command generation unit 1011 corresponds to the internal command generator 510 shown in FIG. 5. The operations of the first command generation unit 1011 and the second command generation unit 1012 will be described later in detail, and the number of times that the first internal active signal INN_ACT1 generated in the first command generation unit 1011 is enabled is greater than the number of times that the active command signal ACT is activated, and the number of times that the second internal active signal INN_ACT2 generated in the second command generation unit 1012 is enabled is the same as the number of times that the active command signal ACT is activated.

The counter 1020 counts the number of times that the first internal active signal INN_ACT1 is activated and the number of times that the second internal active signal INN_ACT2 is activated. The counter 1020 may include a first counting unit 1021 and a second counting unit 1022. The first counting unit 1021 counts the number of times that the first internal active signal INN_ACT1 is activated, and the second counting unit 1022 counts the number of times that the second internal active signal INN_ACT2 is activated.

The comparator 1030 compares an output signal (which is referred to as 'a first counting value') of the first counting unit 1021 with an output signal (which is referred to as 'a second counting value') of the second counting unit 1022, and generates a selection signal SEL, which is to be described again later. The comparator 1030 compares the first counting value and the second counting value with each other and generates the selection signal SEL based on, for example, the greater counting value. The selection signal SEL is a signal for performing a control to transfer one between the output signals of a first address storing unit 1041 and a second address storing unit 1042 to the refresh operation driver 1060.

The address storage 1040 stores an address signal ADD in response to the first internal active signal INN_ACT1 and the second internal active signal INN_ACT2. The address storage 1040 may include the first address storing unit 1041 and the second address storing unit 1042. The first address storing unit 1041 stores the address signal ADD in response to the first internal active signal INN_ACT1 and the second address storing unit 1042 stores the address signal ADD in response to the first internal active signal INN_ACT1. The address storage 1040 outputs the output signal of one address storing unit between the first address storing unit 1041 and the second address storing unit 1042 as a target address signal TT_ADD in response to the selection signal SEL.

The enable controller 1050 controls whether to enable a storing operation of the address signal ADD in an arbitrary section. Since the enable controller 1050 has already been described before with reference to FIGS. 5 to 9, a detailed description on the enable controller 1050 is omitted.

The refresh operation driver 1060 performs a refresh operation on the word line corresponding to the target address signal TT_ADD among a plurality of word lines WL in response to the target address signal TT_ADD that is transmitted based on the selection signal SEL. Since the refresh operation driver 1060 is described earlier with reference to FIG. 5, a further description on the refresh operation driver 1060 is omitted.

The semiconductor memory device may perform a counting operation by dividing the active command signal ACT according to the activity type, and select the target address signal TT_ADD based on the selection result. Thus, the active command signal ACT of the activity type that is inputted more continuously may be detected, and thus a refresh operation on the word line corresponding to the active command signal ACT may be performed.

Figure 11:
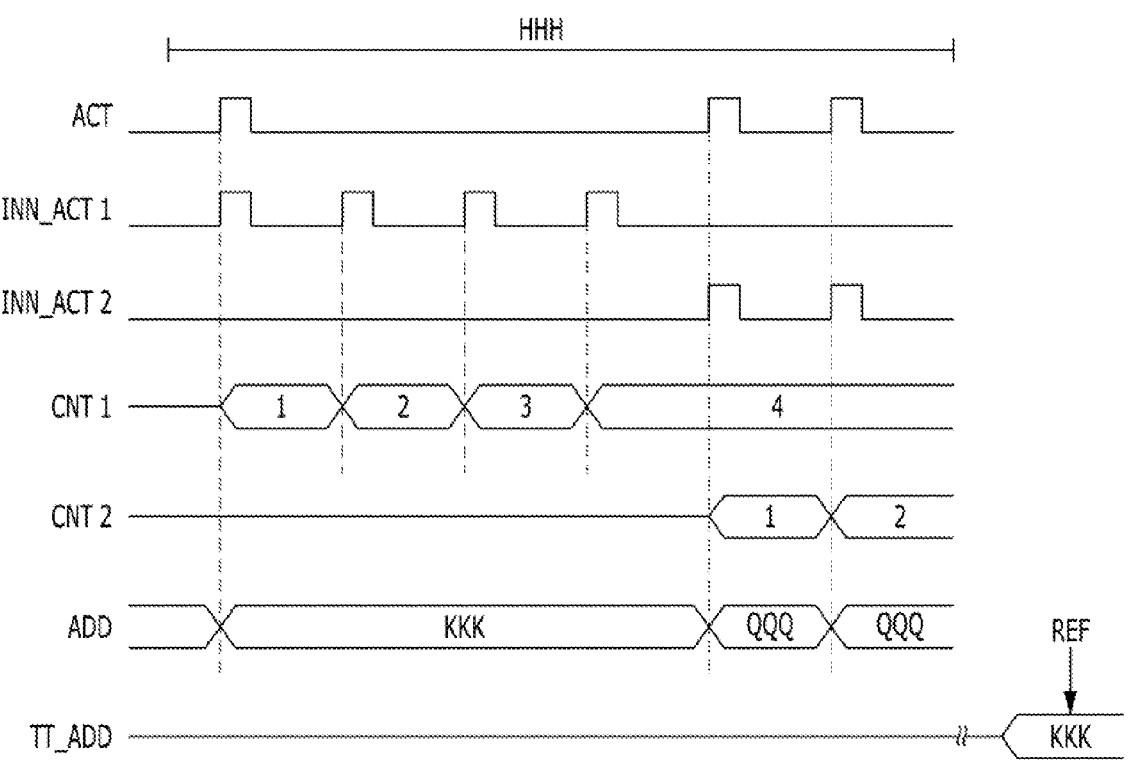
FIG. 11 is a timing diagram for describing an operation of the semiconductor memory device shown in FIG. 10.

FIG. 11 is a timing diagram for describing an operation of the semiconductor memory device shown in FIG. 10. FIG. 11 shows the active command signal ACT, the first internal active signal INN_ACT1, the second internal active signal INN_ACT2, the first counting value CNT1, the second counting value CNT2, the address signal ADD, and the target address signal TT_ADD. FIG. 11 also shows an arbitrary section HHH that is set by the enable controller 1050.

Referring to FIGS. 10 and 11, the active command signal ACT is activated in the arbitrary section HHH. The active command signal ACT of the first activity type or the second activity type may be inputted, or a mixture of the active command signal ACT of the first activity type and the active command signal ACT of the second activity type may be inputted. FIG. 11 shows a case where a mixture of the active command signal ACT of the first activity type and the active command signal ACT of the second activity type are inputted. As illustrated in FIGS. 10 and 11, the active command signal ACT of the first activity type denotes a case where a signal KKK, which is an address signal ADD inputted when the active command signal ACT is activated once, is maintained for a predetermined time or longer, The active command signal ACT of the second activity type denotes a case where a signal QQQ, which is the same address signal ADD, is newly inputted whenever the active command signal ACT is activated. Herein, when the active command signal ACT of the second activity type is inputted, the active command signal ACT is activated several times within a predetermined time, and the active command signal ACT of the second activity type may include a case where the same address signal ADD is not continuously applied. In short, another address signal ADD may be interposed between the signal QQQ, which is the address signal ADD based on the first active command signal ACT of the second activity type, and the signal QQQ, which is the address signal ADD based on the second active command signal ACT of the second activity type.

Meanwhile, FIG. 11 shows a case where the active command signal ACT of the first activity type is inputted once and the active command signal ACT of the second activity type is inputted twice. As described earlier, the active command signal ACT of the first activity type is used to generate the first internal active signal INN_ACT1, and the active command signal ACT of the second activity type is used to generate the second internal active signal INN_ACT2. In short, the first command generation unit 1011 generates the first internal active signal INN_ACT1 that is activated four times in response to the active command signal ACT having an active section that is activated for a predetermined time or longer, and the second command generation unit 1012 generates the second internal active signal INN_ACT2 that is activated twice in response to the active command signal ACT that is activated a predetermined number of times within a predetermined time.

Subsequently, the first counting unit 1021 and the second counting unit 1022 count the number of times that the first internal active signal INN_ACT1 and the second internal active signal INN_ACT2 are activated and generate a first counting value CNT1 and a second counting value CNT2. The first counting value CNT1 becomes '4', which is the number of times that the first internal active signal INN_ACT1 is activated, and the second counting value CNT2 becomes '2', which is the number of times that the second internal active signal INN_ACT2 is activated. The comparator 1030 compares the first counting value CNT1, which is '4', and the second counting value CNT2, which is '2', with each other, and generates the selection signal SEL. Since the first counting value CNT1 is greater than the second counting value CNT2, the selection signal SEL performs a control to output the address signal ADD stored in the first address storing unit 1041.

Meanwhile, the first address storing unit 1041 stores the signal KKK, which is the address signal ADD, in response to the first internal active signal INN_ACT1, and the second address storing unit 1042 stores the signal QQQ, which is the address signal ADD and inputted first in response to the second internal active signal INN_ACT2. The target address signal TT_ADD becomes the signal KKK that is stored in the first address storing unit 1041 based on the above-described selection signal SEL. The target address signal TT_ADD being the signal KKK means that a refresh operation may be performed on the word line corresponding to the signal KKK in response to a refresh command signal REF that is activated during the refresh operation.

FIG. 11 shows a case where the number of times that the first internal active signal INN_ACT1 is activated is greater than the number of times that the second internal active signal INN_ACT2 is activated. However, if the number of times that the second internal active signal INN_ACT2 is activated is greater than the number of times that the first internal active signal INN_ACT1 is activated, the target address signal TT_ADD becomes the signal QQQ, and a word line corresponding to the signal QQQ is activated.

The semiconductor memory device may divide the active command signal ACT inputted during the arbitrary section HHH according to the command type, and set up the address ADD corresponding to the command type that is activated most frequently during the predetermined section HHH as the target address signal TT_ADD.

Figure 12:
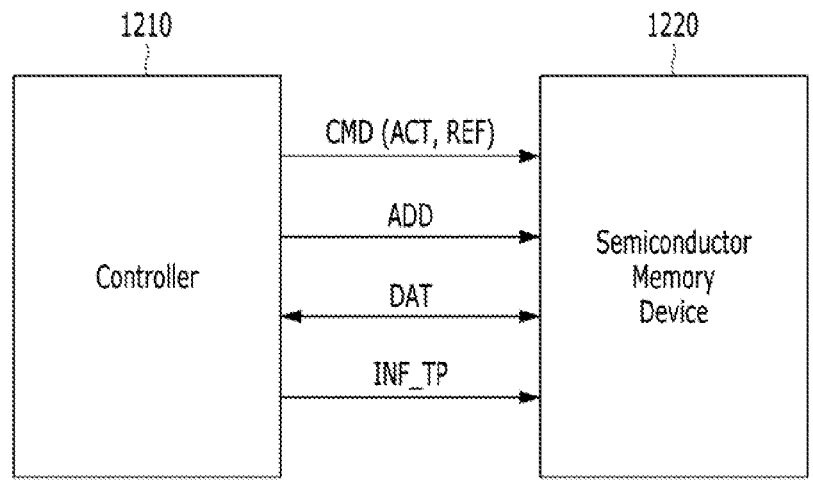
FIG. 12 is a block diagram illustrating a memory system in accordance with an embodiment of the present invention.

FIG. 12 is a block diagram illustrating a memory system in accordance with an embodiment of the present invention.

Referring to FIG. 12, the memory system may include a controller 1210 and a semiconductor memory device 1220.

The controller 1210 provides the semiconductor memory device 1220 with a command signal CMD, an address signal ADD, and data DAT and controls the semiconductor memory device 1220 to process the data DAT. The command signal CMD may include an active command signal ACT and a refresh command signal REF other than command signals for read and write operations of the data DAT. Also, the controller 1210 provides the semiconductor memory device 1220 with access type information INF_TP. The access type information INF_TP is information on the type of active operation, and the access type information INF_TP may be different according to the kind of data DAT processed by the controller 1210.

To be specific, when the data DAT to be processed has to be accessed for a predetermined time or longer, in other words, when the word line corresponding to the data DAT has to be activated for a predetermined time or longer, it means that the active command signal ACT is activated for a predetermined time or longer. In this case, the type of the active command signal ACT corresponds to the above-described first activity type. Subsequently, for example, when the data DAT to be processed has to be activated within a predetermined time, in other words, the word line storing the data DAT has to be activated a predetermined number of times within a predetermined time, it means that the active command signal ACT is activated a predetermined number of times within a predetermined time, which corresponds to the case of the second activity type described above.

The data DAT processed by the controller 1210 may not have one access type. In this case, the access type information INF_TP has the information on the access type corresponding to the mostly processed data DAT. To take an example, if there are more data DAT having a longer access time than a predetermined time among the data DAT processed by the controller 1210, the information is provided as the access type information INF_TP. The semiconductor memory device 1220 may perform a refresh operation corresponding to the data DAT that takes the majority of the processed data DAT. This will be described again later on.

Subsequently, the semiconductor memory device 1220 may perform a read/write operation on the data DAT under the control of the controller 1210. In particular, the access type information INF_TP is used in a control operation for storing a refresh target address. The refresh target address is stored based on an internal control signal. This will be described again later on. The semiconductor memory device 1220 may modify the internal control signal based on the access type information INF_TP and the refresh target address may be stored based on the deformed internal control signal. Herein, the internal control signal may include all the control signals that are controlled to store the refresh target address. For example, as described earlier in the above-described embodiments, if the refresh target address is stored based on an internal active command signal the internal active command signal may also be included in the internal control signal.

Subsequently, the semiconductor memory device 1220 performs a refresh operation on the word line corresponding to the refresh target address in response to the refresh command signal REF, which is a command signal CMD.

The memory system may control the operation of storing the refresh target address by using the access type information INF_TP. Although described above, the access type information INF_TP corresponds to the processed data DAT. Therefore, the memory system may control the refresh operation of the semiconductor memory device 1220 based on the data DAT used in the controller 1210.

Meanwhile, the semiconductor memory device 1220 may correspond to the semiconductor memory device of the structure shown in FIG. 10. The access type information INF_TP is inputted to each constituent element of the semiconductor memory device to change the internal control signals. Hereafter, a case where the access type information INF_TP is inputted to a command generator (which corresponds to the command generator 1010) is representatively described.

Figure 13:
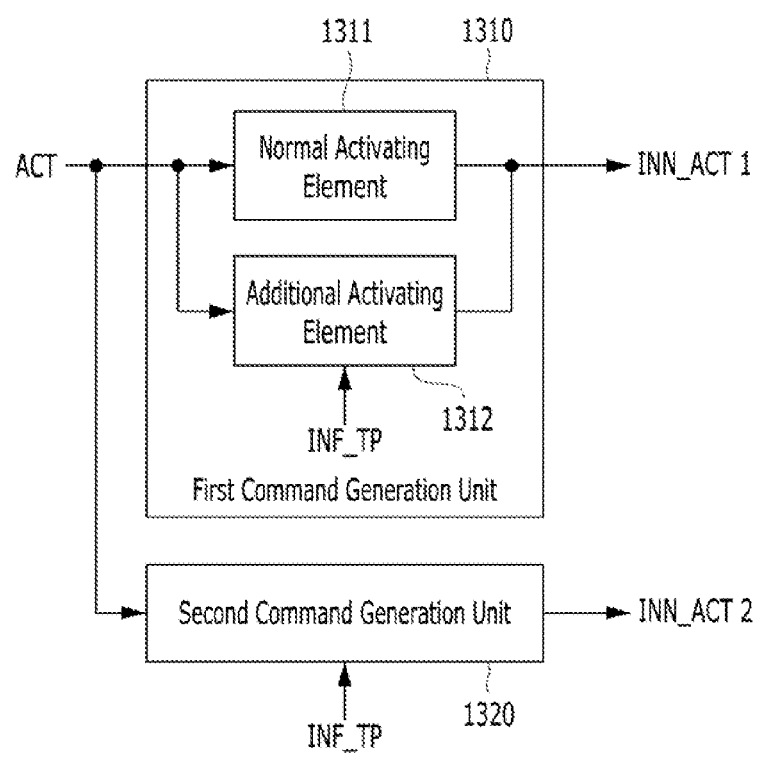
FIG. 13 is a detailed diagram illustrating a semiconductor memory device shown in FIG. 12.

FIG. 13 is a detailed diagram illustrating a semiconductor memory device 1220 shown in FIG. 12. FIG. 13 shows a case where the access type information INF_TP is inputted to the command generator 1010, and FIG. 14, which is a timing diagram for describing an operation of the memory system shown in FIG. 12, shows a case where the access type information INF_TP is inputted to the counter 1020.

Referring to FIG. 13, the command generator of the semiconductor memory device 1220 controls the frequency of activating a first internal active signal INN_ACT1 and a second internal active signal INN_ACT2 based on the access type information INF_TP. The command generator of the semiconductor memory device 1220 may include a first command generation unit 1310 and a second command generation unit 1320. The first command generation unit 1310 generates the first internal active signal INN_ACT1 in response to the active command signal ACT of the first activity type, and the second command generation unit 1320 generates the second internal active signal INN_ACT2 in response to the active command signal ACT of the second activity type.

First of all, the first command generation unit 1310 may include a normal activating element 1311 and an additional activating element 1312.

The normal activating element 1311 activates the first internal active signal INN_ACT1 in response to the active command signal ACT. The activating moment of the active command signal ACT corresponds to the activating moment of the first internal active signal INN_ACT1. This signifies that the number of times that the first internal active signal INN_ACT1 is activated corresponds to the number of times that the internal active signal INN_ACT is activated.

The additional activating element 1312 activates the first internal active signal INN_ACT1 in response to a time corresponding to the access type information INF_TP after the active command signal ACT is activated. While the additional activating unit 320 of FIG. 3 activates the internal active signal INN_ACT at every predetermined time, the additional activating element 1312 of FIG. 13 may activate the first internal active signal INN_ACT1 at every time corresponding to the access type information INF_TP. In other words, the activating cycle of the first internal active signal INN_ACT1 may be controlled, and this means that the number of times that the first internal active signal INN_ACT1 is activated may be controlled.

Subsequently, the second command generation unit 1320 controls the number of times that the second internal active signal INN_ACT2 is activated. The second command generation unit 1320 may be formed of a circuit capable of controlling the number of times that a shifting operation is performed based on the access type information INF_TP, which means that the number of times that the active command signal ACT is activated may be controlled to be the same as the number of times that the second internal active signal INN_ACT2 is activated, or that the second internal active signal INN_ACT2 may be controlled to be activated once whenever the active command signal ACT is inputted twice. This also means that the number of times that the second internal active signal INN_ACT2 is activated may be controlled based on the access type information INF_TP as well.

FIG. 13 shows a case where the access type information INF_TP is inputted to both of the first command generation unit 1310 and the second command generation unit 1320. However, as shown in FIG. 14, there is no drawback if one command generation unit between the first command generation unit 1310 and the second command generation unit 1320 is controlled based on the access type information INF_TP.

Hereafter, a refresh operation in relation to controlling the number of times that the first internal active signal INN_ACT1 and the second internal active signal INN_ACT2 are activated is described.

Referring back to FIG. 10, the counter 1020 counts the number of times that the first internal active signal INN_ACT1 and the second internal active signal INN_ACT2 are activated, and the comparator 1030 generates a selection signal SEL for selectively outputting a refresh target address based on the counting value. In short, the refresh target address is decided based on the number of times that the first internal active signal INN_ACT1 and the second internal active signal INN_ACT2 are activated. Therefore, the mentioning that the number of times that the first internal active signal INN_ACT1 and the second internal active signal INN_ACT2 are activated is controlled based on the access type information INF_TP signifies that although the active command signal ACT of the same condition is inputted, the refresh target address that is stored based on the access type information INF_TP may be different.

Figure 14:
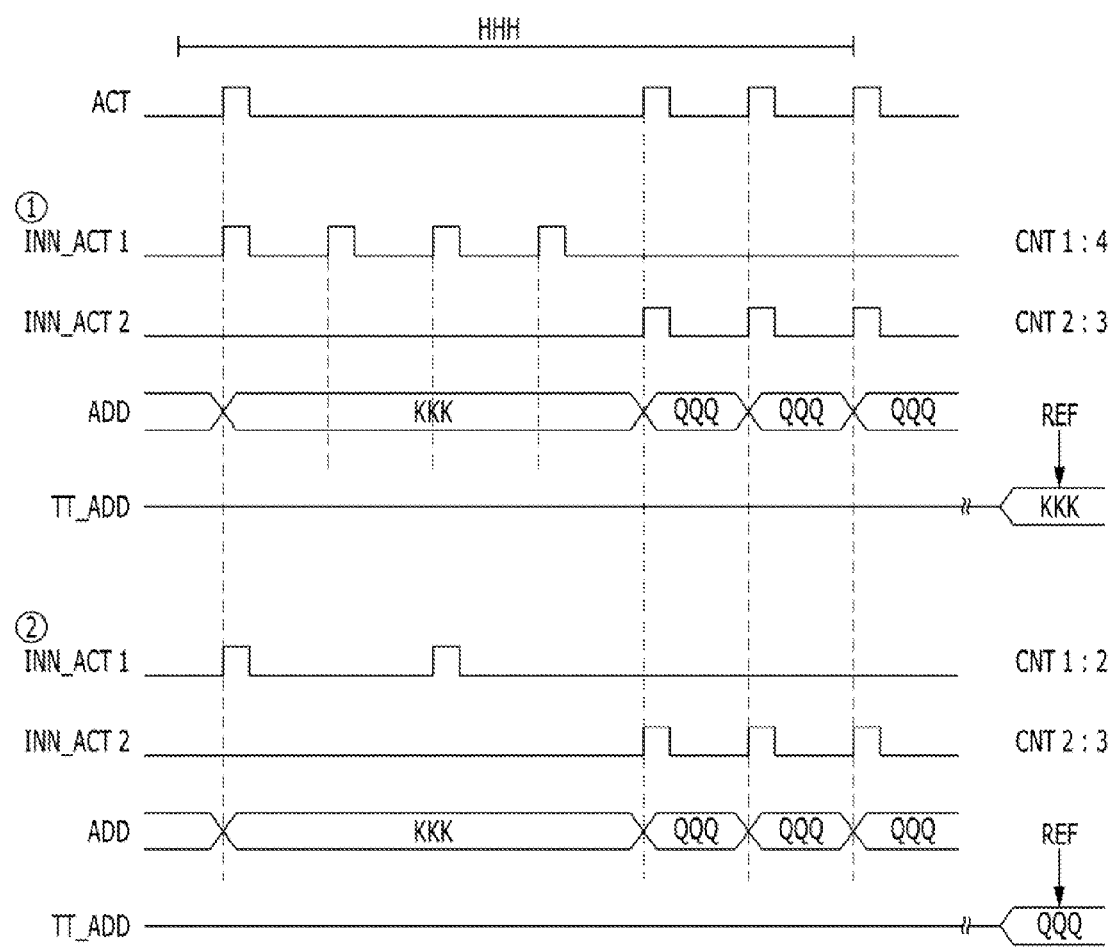
FIG. 14 is a timing diagram for describing an operation of the memory system shown in FIG. 12.

FIG. 14 is a timing diagram for describing an operation of the memory system shown in FIG. 12. FIG. 14 shows the active command signal ACT, the first internal active signal INN_ACT1 the second internal active signal INN_ACT2, a first counting value CNT1, a second counting value CNT2, the address signal ADD, and a target address signal TT_ADD. FIG. 14 shows a case where the number of times that the first internal active signal INN_ACT1 is activated is controlled based on the access type information INF_TP.

First, in case ① the access type information INF_TP is not reflected in the first internal active signal INN_ACT1. In case the number of times that the first internal active signal INN_ACT1 is activated is not controlled. As shown in FIG. 14, in case the first counting value CNT1 obtained by counting the first internal active signal INN_ACT1 is '4', and the second counting value CNT2 obtained by counting the second internal active signal INN_ACT2 is '3'. Therefore, the target address signal TT_ADD becomes a signal KKK, which is the address signal ADD stored in response to the first internal active signal INN_ACT1.

In case ② the access type information INF_TP is reflected in the first internal active signal INN_ACT1. In case ② the number of times that the first internal active signal INN_ACT1 is activated, which is the activating cycle of the first internal active signal INN_ACT1, is controlled to be longer than that of case ①. Although the same active command signal ACT is inputted in case ① and case ②, the first counting value CNT1 obtained by counting the first internal active signal INN_ACT1 is '2' in case ②, which is different from case ①, and the second counting value CNT2 obtained by counting the second internal active signal INN_ACT2 is '3' in case ②, which is the same as case ①. Therefore, the target address signal TT_ADD becomes a signal QQQ, which is the address signal ADD stored in response to the second internal active signal INN_ACT2.

The memory system is capable of deforming the first internal active signal INN_ACT1 based on the access type information INF_TP and storing the refresh target address, which is the target address signal TT_ADD. The fact that the refresh operation is performed by storing the refresh target address based on the access type information INF_TP means that the refresh operation is controlled based on the data DAT processed by the controller 1210 after all.

As described above, the semiconductor memory device may perform a counting operation by dividing an active command signal according to the activity type, and store a refresh target address based on the counting result. This signifies that the semiconductor memory device performs the refresh operation based on the activity type of the active command signal.

Also, the memory system may store the refresh target address based on the access type information provided by the controller. This signifies that the semiconductor memory device performs the refresh operation based on the data used in the controller.

Meanwhile, FIGS. 13 and 14 show where the access type information INF_TP is inputted into the first command generation unit 1310. However, the access type information INF_TP may be inputted into the counter 1020 (see FIG. 10) as well, and this is also included in the scope and concept of the present invention. In this case, the counting unit of the counter 1020 may be controlled based on the access type information INF_TP and, as a result, the first counting value CNT1 and the second counting value CNT2, which are shown in FIG. 14, may be obtained.

According to the embodiments of the present invention, data reliability of a semiconductor memory device may be increased by retaining the data stored in the memory cells for a long time by stably performing a refresh operation.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
 a command generator suitable for generating an internal active command signal corresponding to an active command signal, wherein, when an active section of the active command signal lasts for a predetermined time or longer, the internal active command signal is additionally activated;
 an address storage suitable for storing an address signal based on an activation number of the internal active command signal; and
 a refresh operation driver suitable for performing a refresh operation on a word line corresponding to the stored address signal,
 wherein the command generator includes:
  a normal activating unit for activating the internal active command signal based on the active command signal; and
  an additional activating unit for additionally activating the internal active command signal based on the predetermined time.

2. The semiconductor memory device of claim 1, further comprising:
an enable controller suitable for controlling whether to enable an operation of storing the address signal in an arbitrary section.

3. A semiconductor memory device, comprising:
a command generator suitable for receiving an active command signal, and modifying the received active command signal to an internal active command signal corresponding to an activity type;
an address storage suitable for storing an address signal based on an activation number of the internal active command signal;
a counter suitable for counting the internal active command signal corresponding to the activity type; and
a refresh operation driver suitable for receiving the address signal corresponding to an output signal of the counter, and performing a refresh operation on a word line corresponding to the stored address signal,
wherein the activity type is divided into a first activity type and a second activity type,
wherein the first activity type is determined based on an active section of the active command signal, and the second activity type is determined based on the number of times that the active command signal is activated in a predetermined section.

4. The semiconductor memory device of claim 3, further comprising:
a first command generator suitable for generating a first internal active command signal when the active command signal of the first activity type is received; and
a second command generator suitable for generating a second internal active command signal when the active command signal of the second activity type is received.

5. The semiconductor memory device of claim 4, wherein the first activity type includes an active command signal having an active section where the active command signal is activated for a predetermined time or longer, and
the number of times that the first internal active command signal is activated exceeds the number of times that the active command signal of the first activity type is activated.

6. The semiconductor memory device of claim 4, wherein the second activity type includes an active command signal that is activated a predetermined times within a predetermined time, and
the number of times that the second internal active command signal is activated corresponds to the number of times that the active command signal of the second activity type is activated.

7. The semiconductor memory device of claim 4, wherein the address storage includes:
a first address storing unit for storing the address signal based on the first internal active command signal; and
a second address storing unit for storing the address signal based on the second internal active command signal.

8. The semiconductor memory device of claim 4, wherein the counter includes:
a first counting unit for counting the number of times that the first internal active command signal is activated; and
a second counting unit for counting the number of times that the second internal active command signal is activated.

9. The semiconductor memory device of claim 8, further comprising:
a comparator suitable for comparing a counting value of the first counting unit and a counting value of the second counting unit with each other.

10. The semiconductor memory device of claim 9, wherein the address storage provides the refresh operation driver with the address signal that is stored based on the internal active command signal corresponding to one of the first internal active command signal and the second internal active command signal based on an output signal of the comparator.

11. The semiconductor memory device of claim 3, further comprising:
an enable controller suitable for controlling whether to enable an operation of storing the address signal in an arbitrary section.

12. A memory system, comprising:
a controller suitable for generating access type information corresponding to data to be processed; and
a semiconductor memory device suitable for performing a read/write operation on the data under control of the controller, modifying an internal control signal for storing a refresh target address based on the access type information, and performing a refresh operation on a word line corresponding to the refresh target address,
wherein the internal control signal is generated by modifying an active command signal provided by the controller,
wherein the semiconductor memory device includes:
a command generator suitable for receiving the active command signal and modifying the received active command signal to an internal active command signal corresponding to an activity type;
an address storage suitable for storing an address signal based on an activation number of the internal active command signal;
a counter suitable for counting the internal active command signal corresponding to the activity type; and
a refresh operation driver suitable for receiving the address signal corresponding to an output signal of the counter, and performing a refresh operation on a word line corresponding to the stored address signal.

13. The memory system of claim 12, wherein the access type information corresponds to an access time of the data.

14. The memory system of claim 12, wherein the command generator controls the number of times that the internal active command signal is activated based on the access type information.

15. The memory system of claim 12, wherein the counter controls a counting unit based on the access type information.

16. The memory system of claim 12, wherein the activity type is divided into a first activity type and a second activity type, wherein the first activity type is determined based on an active section of the active command signal, and wherein the second activity type is determined based on the number of times that the active command signal is activated in a predetermined section.

* * * * *